United States Patent [19]

Idler et al.

[11] Patent Number: 5,355,424
[45] Date of Patent: Oct. 11, 1994

[54] METHOD OF OPERATING A SEMICONDUCTOR DEVICE AS AN OPTICAL FILTER AND SEMICONDUCTOR DEVICE FOR IMPLEMENTING THE METHOD

[75] Inventors: Wilfried Idler, Asperg; Gert Laube; Michael Schilling, both of Stuttgart; Klaus Wünstel, Schwieberdingen; Dieter Baums, Ludwigsburg; Olaf Hildebrand; Kaspar Dütting, both of Stuttgart, all of Fed. Rep. of Germany

[73] Assignee: Alcatel, N.V., Amsterdam, Netherlands

[21] Appl. No.: 935,885

[22] Filed: Aug. 27, 1992

[30] Foreign Application Priority Data

Sep. 10, 1991 [DE] Fed. Rep. of Germany .... 4130047.5

[51] Int. Cl.$^5$ .............................................. G02B 6/12
[52] U.S. Cl. ...................................... 385/14; 385/47; 385/45
[58] Field of Search ............................ 385/14, 1, 2-13, 385/15, 45, 47

[56] References Cited

U.S. PATENT DOCUMENTS

| 4,984,861 | 1/1991 | Suchoski, Jr. et al. | 385/14 X |
| 5,088,097 | 2/1992 | Ono et al. | 385/2 X |
| 5,105,433 | 4/1992 | Eisele et al. | 372/50 |
| 5,123,068 | 6/1992 | Hakoun et al. | 385/14 |
| 5,214,725 | 5/1993 | Yanagawa et al. | 385/45 |

FOREIGN PATENT DOCUMENTS 1206313 8/1989 Japan .

OTHER PUBLICATIONS

Hirose et al., "An Array of GaAlAs ... ", Transcations of the I.E.C.E. of Japan, vol. E-69, No. 4, Apr. 1986, pp. 392-394.
Patent Abstracts of Japan, vol. 6, No. 195 (P-146) [1073] Oct. 5, 1982 & JP-A-57-104902, Jun. 30, 1982.
Patent Abstracts of Japan, vol. 9, No. 118 (E-316) May 23, 1985 & JP-A-60-009 189.
Schilling et al., "Widley Tunable Y-Coupled Cavity Integrated Interferometric Injection Laser," *Electronics Letters*, vol. 24, No. 4, Feb. 15th, 1990, pp. 243-244.
Fleck, Jr., "Linewidth and Conditions for Steady Oscillation in Single and Multiple Element Lasers," *Journal of Applied Physics*, vol. 34, No. 10, Oct. 1963, pp. 2997-3003.
Applied Physics Letters, 54 (1989) May 8th, No. 19, NY T. Numai et al.: "1.5 μm tunable wavelength ... ".
IEEE Journal of Quantum Electronics, vol. 27, No. 6, Jun. 1991; M. Schilling et al.: "Integrated Interferometric Injection ... ".

*Primary Examiner*—John D. Lee
*Assistant Examiner*—Phan Thi Heartney
*Attorney, Agent, or Firm*—Spencer, Frank & Schneider

[57] ABSTRACT

A semiconductor device is operated as an optical filter. The semiconductor device has a substrate and a monolithically integrated branched waveguide structure disposed above the substrate, portions of the waveguide structure being divided into a plurality of regions by troughs, one of the regions being a branching region. Light is radiated into the waveguide structure at an end face of one of the regions and currents that are smaller than respective laser threshold currents of the regions flow through the regions, including the branching region, perpendicular to a propagation direction of light through the waveguide.

10 Claims, 1 Drawing Sheet

METHOD OF OPERATING A SEMICONDUCTOR DEVICE AS AN OPTICAL FILTER AND SEMICONDUCTOR DEVICE FOR IMPLEMENTING THE METHOD

CROSS REFERENCE TO RELATED APPLICATION

This application claims the priority of application Ser. No. P 41 30 047.5, filed Sep. 10, 1991, in the Federal Republic of Germany, the subject matter of which is incorporated herein by reference.

BACKGROUND OF THE INVENTION

1. Field of the Invention

The invention relates to a method of operating a semiconductor device as an optical filter and to a semiconductor device to be operated according to this method and wherein the semiconductor device includes a substrate and a monolithically integrated waveguide layer having a branched, simply contiguous structure.

2. Background Information

The publication Electronics Letters 24 (1990), pages 243-244, discloses a semiconductor device which is there operated as a semiconductor laser. The semiconductor device is monolithically integrated on an n-doped indium phosphide substrate. A likewise n-doped buffer layer of indium phosphide extends above the indium phosphide substrate. A waveguide layer of indium gallium arsenide phosphide (InGaAsP) lies on the planar surface of the buffer layer. The waveguide layer has the shape of the letter "Y". Further layers are provided above the waveguide layer. These layers together with the waveguide layer form a Y-shaped mesa above the buffer layer.

Above the waveguide layer, the surface of the semiconductor laser is covered with a metal layer that is sectioned off by three troughs, thus creating four regions into which the semiconductor laser is subdivided. The waveguide layer extends over all regions. In every region, a current can be applied to the metal layer to flow through the waveguide layer to a metal layer on the underside of the substrate which constitutes the ground contact.

If the current in one of the regions exceeds a certain threshold, the transparency current, the waveguide layer in the respective region becomes "transparent", that is light transmissive. If the current increases further, the laser threshold current of the respective region is exceeded, that is, the waveguide layer becomes laser active in this region and produces coherent light.

The publication J. Appl. Phys. 34 (1963), pages 2997-3003, discloses the determination of the line width and the prerequisites for continuous operation of multi-segment lasers. These are discussed on the basis of the marginal conditions for a Fabry-Pérot resonator.

SUMMARY OF THE INVENTION

It is an object of the invention to provide a method for filtering light that is radiated from outside into one of the regions existing on the semiconductor device.

It is another object of the invention to provide a semiconductor device that is suitable for implementing the method.

One advantage of this method and of this device is that its filter frequency can be influenced over a broad band range in that the currents flowing through the regions are changed. This advantage can be utilized, in particular, for optical transmissions in which, for example, wavelength channels are to be selected for wavelength division multiplex operation.

This is accomplished according to a method in an embodiment of the invention wherein light is radiated into one of a plurality of waveguide layer regions and currents that are smaller than the respective laser threshold current of the regions flow through the regions and a branching region perpendicular to a propagation direction of the light. In an embodiment of the device, free end faces of the waveguide regions are coated with a dielectric layer.

It is particularly advantageous if, in order to detect the light signals, a current flows in the reverse direction through a region that is disposed downstream of the branching region when seen in the transmission direction. The resulting attenuation of the light signals can be compensated in other regions that act as optical amplifiers.

BRIEF DESCRIPTION OF THE DRAWINGS

The invention will now be described in greater detail with reference to embodiments thereof that are illustrated in the drawing figures, in which.

DETAILED DESCRIPTION OF THE PREFERRED EMBODIMENTS

Figure 1:
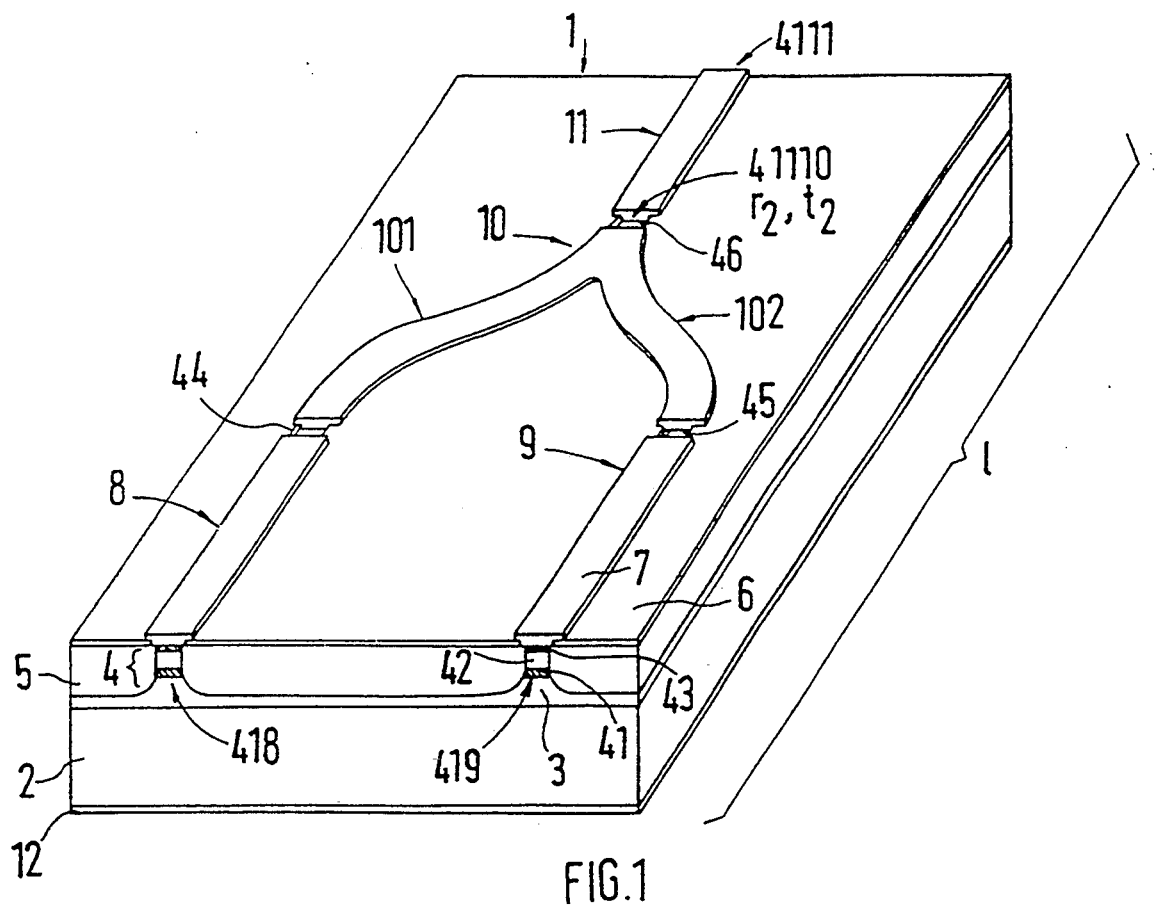
FIG. 1 depicts the configuration of the semiconductor device for implementing the method.
Figure 2:
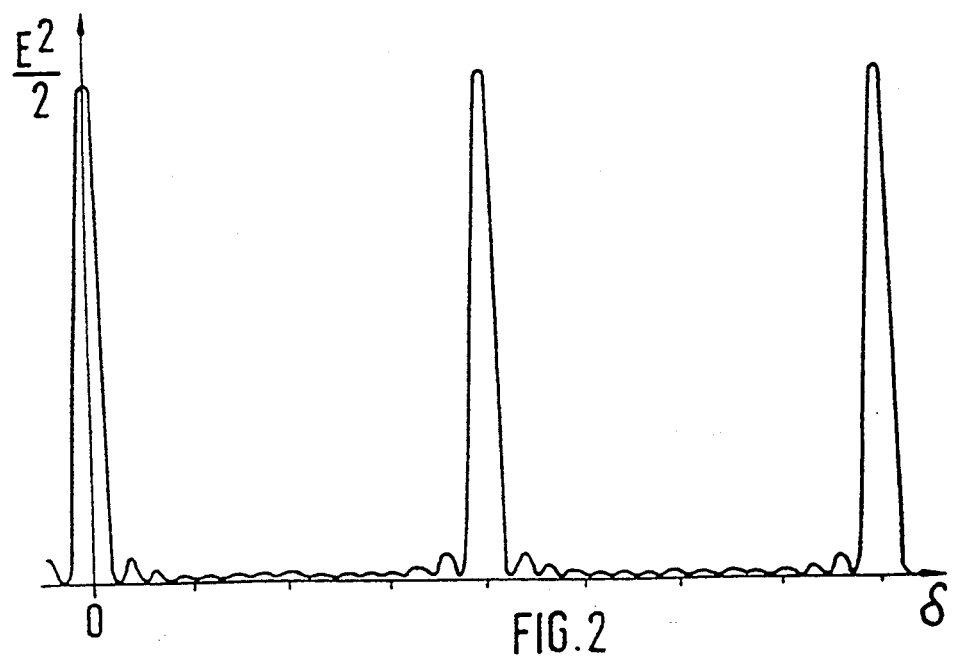
FIG. 2 shows the intensity of the light emanating from the waveguide layer of the semiconductor device as a function of the phase $\delta$.

FIG. 1 shows a semiconductor device 1. It includes a substrate 2 of n-doped indium phosphide. Above it lies a buffer layer 3 which is likewise composed of n-doped indium phosphide and of which part forms the lowermost layer of a mesa 4 that has the shape of a "Y". Mesa 4 includes several layers, one of them a waveguide layer 41 of indium gallium arsenide phosphide. This layer is covered by a covering layer 42 of p-doped indium phosphide. Above it lies a contact layer 43 of $p^+$-doped indium gallium arsenide.

On the side of mesa 4 and above the surface of buffer layer 3 where it is not covered by layer 41, a layer 5 of semi-insulating indium phosphide is provided as an optical waveguide. Its upper surface forms a plane with the upper surface of contact layer 43. Layer 5 is covered by a protective layer 6 of silicon dioxide, contact layer 43 is covered by a metal layer 7.

Three troughs 44, 45 and 46 are provided in metal layer 7 and mesa 4, dividing mesa 4 into a first region 8, a second region 11, a third region 9 and a branching region 10. According to the illustration in FIG. 1, troughs 44, 45 and 46 must extend into covering layer 42 but not into waveguide layer 41 in order to provide optical coupling between regions 8, 9, 11 and branching region 10. In each one of regions 8, 9 and 11 and in branching region 10, metal layer 7 forms a first electrode. A second electrode for each region 8, 9 and 11 and branching region 10 is formed by a metal layer 12 applied to the underside of substrate 2. During operation of semiconductor device 1, an individually fixed or variable current flows from metal layer 7 through each region 8, 9 and 11 and branching region 10 to metal layer 12 which serves as ground contact.

The currents flowing through regions 8, 9 and 11 and through branching region 10 are smaller than the respective laser threshold currents.

Light from which a certain wavelength is to be filtered out preferably flows into the free end of region 11. The light is, for example, composed of light signals in a wavelength division multiplex of, for example, four wavelengths, from which one wavelength is to be filtered out.

Semiconductor device 1 acts as a Fabry-Pérot resonator having two arms formed by regions 8 and 9.

Waveguide layer 41 can be understood as the superposition of two Fabry-Pérot resonators. A first Fabry-Pérot resonator is formed by regions 11 and 8 and a branch 101 of branching region 10 which connects them together; a second Fabry-Pérot resonator is formed by regions 11 and 9 and a branch 102 of branching region 10 which connects them together. Correspondingly, the semiconductor device has a filter spectrum that corresponds to the superposition of the spectra of two mutually slightly detuned Fabry-Pérot resonators The intensity $I=E^2/2$ plotted as a function of phase $\delta$, has high maxima a, b and c at long intervals and low maxima at short intervals. These maxima correspond to a coarse structure and a fine structure of resonances in waveguide layer 41.

Corresponding to their lengths $l_8$ and $l_9$ and their refractive indexes $n_8$ and $n_9$, as they result on the basis of the respective currents flowing through them, regions 8 and 9 influence the distance $\Delta f_1$ between the optical resonances (maxima) to be attributed to the fine structure.

The following applies:

$$\Delta f_1 = \frac{c/2}{2l_{11} + l_8 + l_9}$$

if the length of branching region 10 is neglected or is also considered in connection with the lengths of regions 8, 9 and 11.

For a semiconductor device having a length of 1.5 mm and including a waveguide layer 41 of indium gallium arsenide phosphide, this means the following:

$$\Delta f_1 = 14 \text{ GHz}$$

The distance $\Delta f_s$ between the optical resonances to be associated with the coarse structure is the following:

$$\Delta f_s = \frac{c}{l_3 - l_4}$$

If now an optical wavelength difference results between the length $l_8$ of region 8 and the length $l_9$ of region 9, which is based exclusively on the difference between refractive indices $n_8$ and $n_9$, and is caused by different intensities of currents $I_8$ and $I_9$ that flow through the regions, the following applies, for example, if $I_9 - I_8 = 100$ MA:

$$\Delta f_s \approx 86 \text{ THz}$$

$$\frac{\Delta f_s}{\Delta f_g} \approx 6143$$

This means that, in an illustration of the intensity as a function of frequency, 6143 low fine structure maxima fall between two large maxima of the coarse structure. It is here assumed that the current difference of 100 mA corresponds to a path difference of 7 μm. By suitable selection of the difference between currents $I_8$ and $I_9$, it is possible to realize a strong suppression of the fine structure resonances in favor of the coarse structure resonances.

In another embodiment (not shown here), at least one of regions 8 and 9 is divided into two partial regions by means of a trough of the shape of troughs 44, 45 and 46, with a current flowing in the forward direction through the one partial region and through the respective other regions and branching region 10, while a current flows in the reverse direction through the other partial region. This partial region then serves as a photodiode in which part of the light is absorbed and can be employed for detection purposes.

The transmitted portion of the light radiated into waveguide layer 41 from outside, can also be influenced in that, at their free end faces that are congruent with the end faces of semiconductor device 1, regions 8, 9 and 11 are coated with a thin layer of a dielectric material (418, 419, and 4111), for example, silicon nitride, silicon dioxide or silicon oxynitride, or they are coated with several thin layers of a dielectric material, for example, silicon nitride, silicon dioxide or silicon oxynitride.

It will be understood that the above description of the present invention is susceptible to various modifications, changes and adaptations, and the same are intended to be comprehended within the meaning and range of equivalents of the appended claims.

What is claimed is:

1. A method of operating a semiconductor device as an optical filter, the semiconductor device having a substrate and a monolithically integrated branched waveguide structure disposed above the substrate portions of the waveguide structure being divided into a plurality of regions by troughs, one of the regions being a branching region, the method comprising:
   radiating light into the waveguide structure at an end face of one of the regions; and
   flowing currents that are smaller than respective laser threshold currents of the regions through the regions, including the branching region, perpendicular to a propagation direction of light through the waveguide structure.

2. A method according to claim 1, wherein a current flows in a reverse direction in at least one of the regions with respect to a direction of current flow in the other regions.

3. The method of operating a semiconductor device as an optical filter according to claim 2, wherein the at least one region in which the current flows in a reverse direction forms a photodiode, the method further comprising using the photodiode as a detector for regulating currents in the other regions.

4. A semiconductor device comprising:
   a substrate; and
   a monolithically integrated branched waveguide structure disposed above the substrate, portions of the waveguide structure being divided into a plurality of regions by troughs, one of the regions being a branching region;
   wherein free end faces of the regions are coated with a dielectric layer.

5. A semiconductor device according to claim 4, wherein the dielectric layer includes silicon dioxide.

6. A semiconductor device according to claim 4, wherein the dielectric layer includes silicon oxynitride.

7. A semiconductor device according to claim 4, wherein an electrode is provided on a bottom surface of said substrate and wherein the regions of the waveguide structure are each provided with a respective electrode, the electrodes being for flowing currents smaller than the respective laser threshold currents of the regions through the regions in a direction perpendicular to light propagation therethrough to selectively change light transmissive properties of said regions.

8. A method of filtering light which comprises utilizing the semiconductor device of claim 7.

9. The semiconductor device according to claim 7, wherein at least one of the regions is divided into two partial regions by a trough, wherein a current flows in a reverse direction in a first one of the partial regions with respect to a direction of current flow in the other partial region and the other regions, the first one of the partial regions serving as a photodiode in which a part of light absorbed therein is employed for detection purposes for regulating currents in the other regions.

10. A semiconductor device according to claim 4, wherein the dielectric layer includes silicon nitride.

* * * * *